May 20, 1958 J. H. VOGELSONG 2,835,828

REGENERATIVE TRANSISTOR AMPLIFIERS

Filed Aug. 7, 1953 5 Sheets-Sheet 1

INVENTOR
J. H. VOGELSONG
BY W. J. O'Neill
ATTORNEY

REGENERATIVE TRANSISTOR AMPLIFIERS

Filed Aug. 7, 1953 5 Sheets-Sheet 2

INVENTOR
J. H. VOGELSONG
BY W. J. O'Neill
ATTORNEY

REGENERATIVE TRANSISTOR AMPLIFIERS

Filed Aug. 7, 1953 5 Sheets-Sheet 3

INVENTOR
J. H. VOGELSONG
BY W. J. O'Neill
ATTORNEY

INVENTOR
J. H. VOGELSONG
BY W. J. O'Neill
ATTORNEY

May 20, 1958 J. H. VOGELSONG 2,835,828

REGENERATIVE TRANSISTOR AMPLIFIERS

Filed Aug. 7, 1953 5 Sheets-Sheet 5

INVENTOR
J. H. VOGELSONG

BY W. J. O'Neill

ATTORNEY

United States Patent Office 2,835,828
Patented May 20, 1958

2,835,828

REGENERATIVE TRANSISTOR AMPLIFIERS

James H. Vogelsong, Madison, N. J., assignor to Bell Telephone Laboratories, Incorporated, New York, N. Y., a corporation of New York Application August 7, 1953, Serial No. 372,897
10 Claims. (Cl. 307—88.5)

This invention relates to transistor amplifier apparatus, and particularly to pulse regenerative transistor amplifiers suitable for amplifying, reshaping and retiming pulse type signals, and which may be utilized for example in high-speed synchronous switching systems, synchronous serial computers, and for other purposes.

One of the objects of this invention is to provide transistor amplifiers suitable for use at relatively high frequencies.

Another object of this invention is to provide regenerated pulses with wave shapes that may be practically independent of the wave shapes of the applied input pulses.

Another object of this invention is to provide relatively flat-topped output pulses.

Another object of this invention is to provide a circuit more tolerant of the relatively slow recovery of reverse impedance encountered in some crystal diodes.

Another object of this invention is to provide a circuit adapted to avoid the slow recovery of high reverse collector impedance encountered in some transistors.

Another object of this invention is to provide for damped ringing of an output circuit transformer.

Another object of this invention is to substantially eliminate an undesired current ripple at the master clock timing wave source frequency in the output circuit of a regenerative amplifier.

Another object of this invention is to provide improved power efficiency over linear operation in transistor regenerative amplifiers.

Another object of this invention is to stabilize the amplitude of the emitter current in transistors having moderate variations in their emitter characteristics.

Another object of this invention is to limit the current available to the transistor emitter in the event of failure of the master clock timing wave source.

One of the components in certain systems, such as high-speed synchronous switching systems or synchronous serial computers, may be a pulse regenerative amplifier capable of amplifying, reshaping and retiming pulse type signals. In such systems, logical operations may be carried out in circuits containing passive elements such as asymmetrically conductive rectifiers in the form of known germanium or other suitable crystal diodes, and the regeneration of pulses in amplitude, shape and time may be provided by circuits containing active elements such as a gain source in the form of point contact or other suitable transistor comprising germanium or other suitable semi-conductor material.

In such arrangements, the transistor source of gain component may comprise a suitable high-speed transistor unit, such as for example a coded transistor unit A1729 or M1831 having a relatively low internal base resistance adapted to make these transistor units stable and suitable for use as a source of gain in high frequency circuits generally, such as wide-band video amplifiers, or in other regenerative amplifiers. Such germanium transistor units may, if desired, be overdriven beyond the linear range thereof to improve the efficiency of operation, and also may have cut-off frequencies suitable for use at high or very high frequencies.

In accordance with this invention, a regenerative amplifier may be provided using a transistor source of gain which may be operated as an overdriven non-linear type amplifier and which may be provided with an external feedback path connecting the output collector electrode thereof with the input emitter electrode thereof to provide regeneration. The external feedback path may be used in conjunction with germanium or other suitable crystal diodes connected therewith to provide pulse regeneration. This mode of operation is in contrast to that of known bi-stable circuits which utilize internal feedback supplied by the base resistance of a bi-stable transistor. An example of such known bi-stable type circuits is disclosed in J. H. Felker Patent 2,670,445, February 23, 1952. It will be noted that in the bi-stable circuit, a triggering arrangement is provided to shift between the two stable points or bi-stable points of the transistor used therewith.

Pulse-regenerative transistor amplifiers in accordance with this invention may be operated at any suitable frequency such as for example at a basic frequency in megacycles per second which, as an illustrative example, may be three megacycles per second. For operation at frequencies of this order, performance is relatively unimpaired by a slow recovery of reverse impedance which is found in some crystal diodes.

In a particular case the crystal diodes connected with the external feedback path leading to the emitter electrode may comprise diode logic circuits such as an Or-circuit and an And-circuit, and a suitable source of input pulses may be connected to the emitter electrode through such diode logic circuits. Also, a master clock timing wave source may be connected to the emitter electrode through one or more of such diode logic circuits. The clock wave source circuit path may be connected to the feedback path leading to the emitter. The current supplied to the emitter may be adjusted for overdriving the transistor source beyond the linear range thereof. The constants in the input circuit to the transistor emitter may be so chosen as to maintain the transistor emitter below the cutoff potential thereof when no input pulse is present from the associated input pulse source.

In accordance with this invention, the master clock wave source, which may comprise a sine wave source for other suitable alternating current wave source, may be connected in circuit with the feedback path leading to the emitter electrode for timing the pulse regeneration. This arrangement may provide for synchronization of the output pulses with the master clock wave source for timing the pulse regeneration. Where the timing wave source is a master clock wave source not derived from the output of the regenerative amplifier, the amplitude of the timing wave derived therefrom may be adjusted independently of changes in the pattern of the transmitted output signal and used in conjunction with the emitter input for controlling the timing of the pulse regeneration.

The positive half-cycle of the master clock wave source may be used in conjunction with a voltage divider provided in the circuit to set the emitter bias in the region of cutoff or just below cutoff during said positive half-cycle, thereby to establish a voltage wave form at the emitter such that the transistor is enabled only during the half-cycle when the clock voltage is positive.

The negative half-cycle of the master clock wave source may be used to draw the emitter potential well below cutoff whereby such negative swing thereof may be utilized to either (*a*) disable the amplifier, or (*b*) provide for transistor turnoff of transistors having limited negative valley voltages, following operation of the amplifier.

A clipping diode circuit may be associated with the sine wave clock source and a voltage divider in order to permit the sine wave clock source to establish a voltage wave form at the emitter such that the emitter bias voltage is maintained essentially constant just below cutoff during the positive half-cycle of the clock voltage wave (Fig. 2 only).

Resistance means may be associated with the master clock wave source to limit the current available to the emitter in the event of failure of the clock wave source.

Means may be provided to adjust the value of voltage for the emitter sufficiently to stabilize the amplitude of the emitter current with moderate variations in transistor emitter characteristics.

Transformer coupling may be incorporated in the transistor output circuit to provide for direct current restoration, and bias voltage may be applied to the transistor collector through the primary winding of the transformer to provide an efficient biasing arrangement with less average power dissipated.

A clamping diode circuit may be connected with the feedback path to reduce undesired current and voltage ripple which may otherwise be developed at the amplifier input and output by the negative half-cycle of the master clock wave source, thereby to substantially eliminate an undesired current at the master clock wave source frequency from appearing in the output circuit.

The transistor may be driven far enough into saturation as partial or slight saturation thereof to obtain a greater or maximum transistor efficiency of operation in respect to the ratio of pulse power to direct current power, and also to aid in flattening pulse tops. The degree of saturation referred to may be limited sufficiently to avoid pulse broadening caused by the "hole-storage" effect.

The overdriven transistor source of gain may be operated over a non-linear range extending from the region of below cutoff thereof to the region of partial or slight saturation thereof.

For a clearer understanding of the nature of this invention and the additional advantages, features, and objects thereof, reference is made to the following description taken in connection with the accompanying drawing, in which like reference characters represent like or similar parts and in which:

Fig. 6 illustrating the voltage-current characteristics for the emitter, and Fig. 7 illustrating the voltage-current characteristics for the collector;

Figure 2:
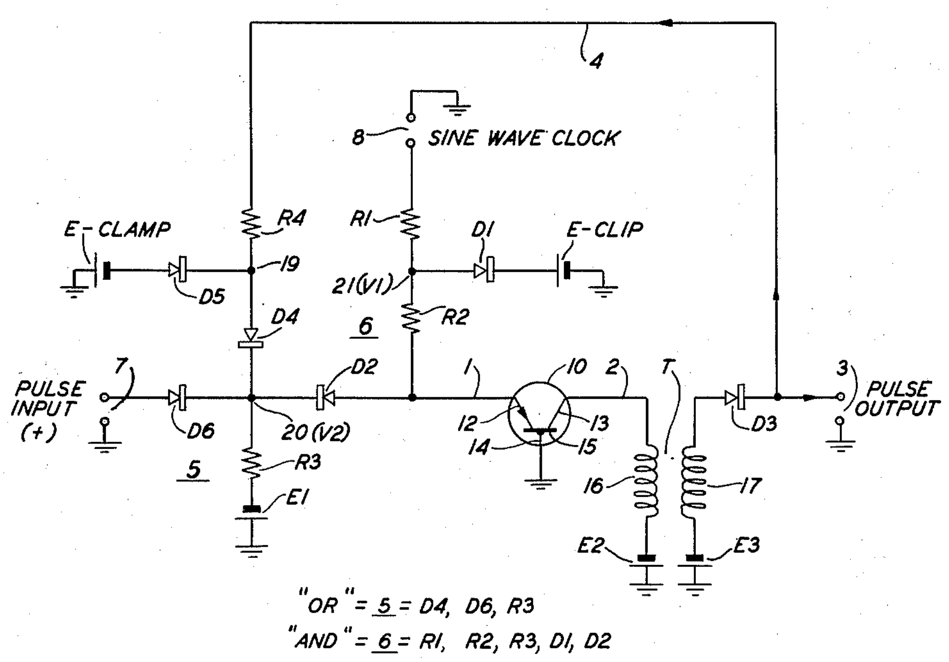
Fig. 2 is a schematic diagram illustrating a pulse regenerative transistor amplifier circuit in accordance with this invention and showing a circuit which may be utilized for implementing the block diagram shown in Fig. 1.
Figures 3, 4:
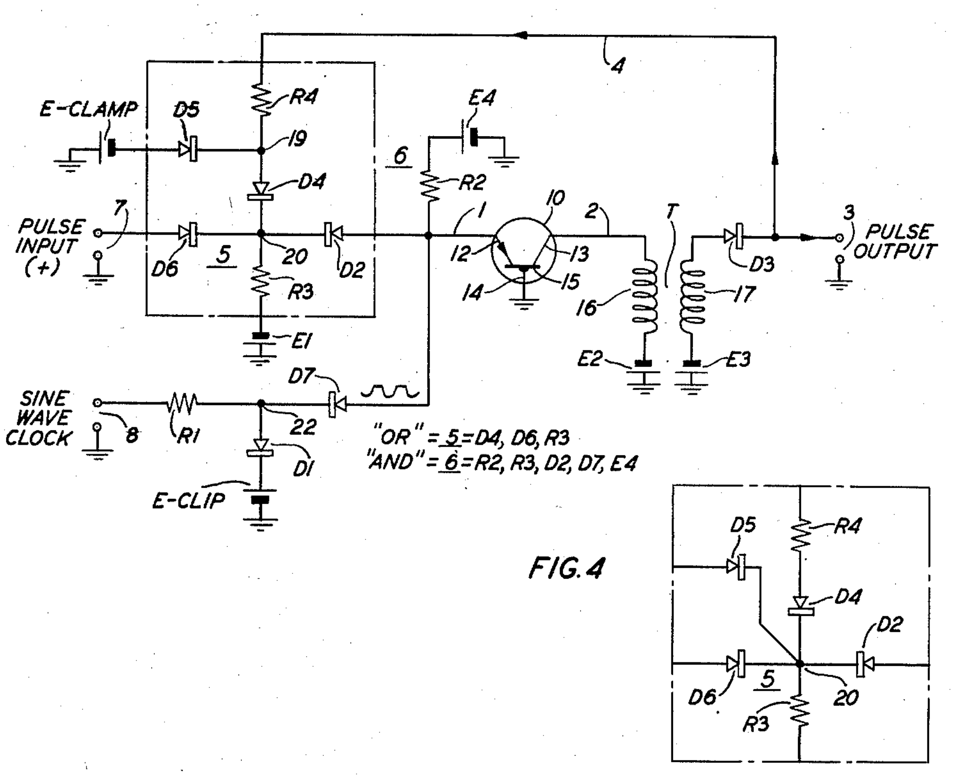
Fig. 3 is a schematic diagram illustrating a pulse regenerative transistor amplifier circuit in accordance with this invention, and showing a modification of the Fig. 2 circuit which may alternatively be utilized for implementing the block diagram shown in Fig. 1.
Fig. 4 is a schematic circuit diagram illustrating a modification in the connection for the clamping diode circuit which may be utilized in place of the connection shown in Figs. 2 or 3 as an alternative arrangement therefor.
Figure 11:
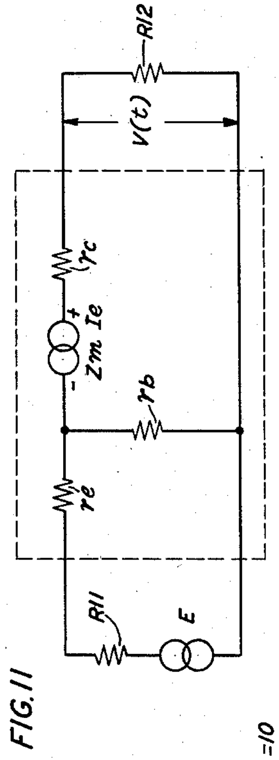
Figure 13:
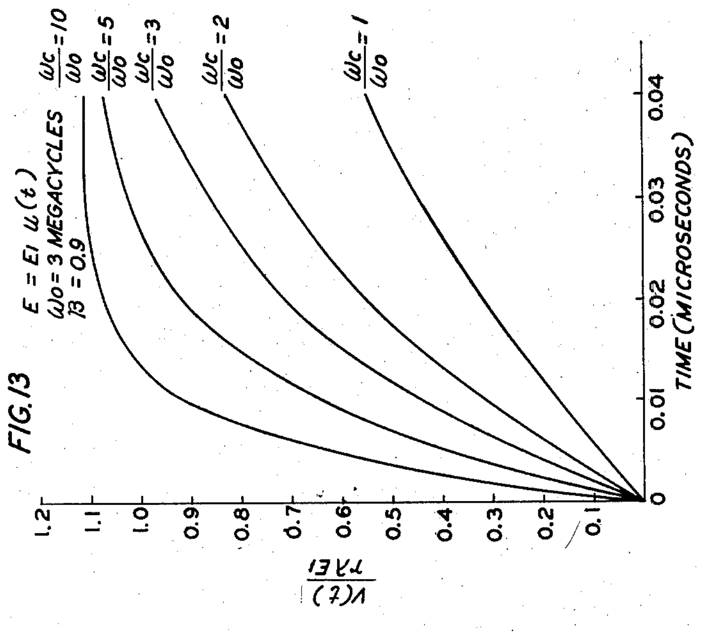
Figure 12:
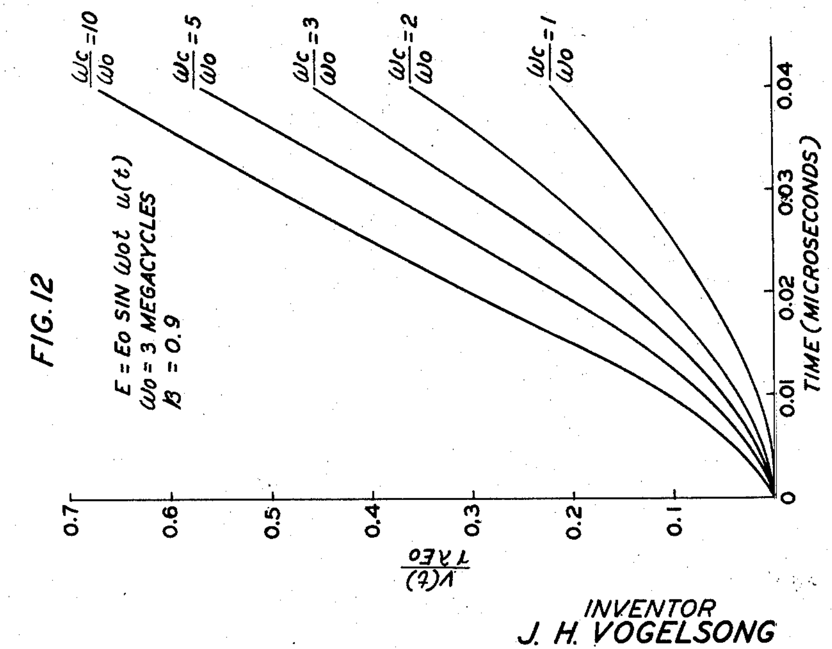

Fig. 11 is a diagram of an equivalent circuit assumed for the circuits of Figs. 2 and 3 for illustrating rise time analysis; and Figs. 12 and 13 are graphs illustrating the influence of transistor cutoff frequency in determining pulse rise time for the regenerative amplifiers of Figs. 2 and 3, respectively.

Figure 1:
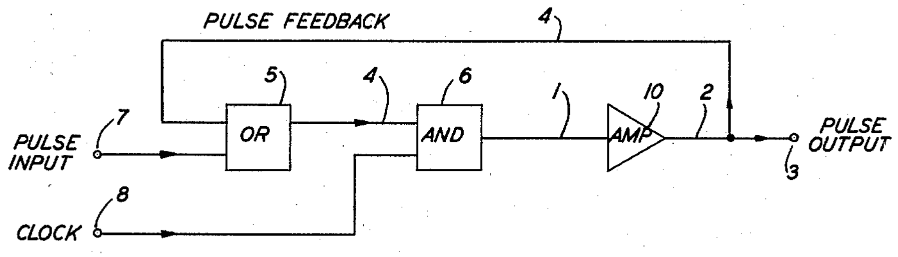
Fig. 1 is a diagram illustrating in functional block diagram form a logical configuration for a pulse regenerative amplifier.

Referring to the drawing, Fig. 1 is a functional block diagram illustrating a logical configuration for a regenerative amplifier. As shown in Fig. 1, the circuit may comprise generally an implifier source of gain 10 having an input circuit 1 and an output circuit 2 which may be connected to an output load circuit 3, an external feedback path 4 connecting the output 2 of the amplifier source 10 with the input 1 thereof, a logic circuit comprising an Or-circuit 5 and an And-circuit 6 connected with the feedback path 4 leading to the input 1 of the amplifier source 10, an input pulse signal source 7 connected with the input 1 of the amplifier gain source 10 through the Or and the And logic circuits 5 and 6, and an alternating current master clock wave source 8 connected with the input 1 of the gain source 10 through the And logic circuit 6. The functional block diagram shown in Fig. 1 may be implemented, in accordance with this invention, by the transistor regenerative amplifier circuits shown in Figs. 2, 3, and 4.

Figs. 2 and 3 show the conventional transistor symbol. The emitter 12 is indicated by the arrow, and the direction of positive emitter current flow is indicated by the direction of the arrow. Thus, a transistor 10 having an n-type semiconductor body is indicated by a symbol in which the emitter arrow points toward the base 14, while one having a p-type body would be indicated by a symbol in which the emitter arrow points away from the base. For convenience in illustration, the conventional transistor symbol has the emitter arrow pointing toward the base, as illustrated in Figs. 2 and 3, and all battery supply and diode rectifier polarities are chosen for the indicated direction of positive emitter current flow. The illustrated embodiments of the invention are not, however, limited to the particular type transistor 10 illustrated.

Fig. 2 is a schematic circuit diagram illustrating a pulse regenerative transistor amplifier circuit which may be utilized to implement the functional block diagram shown in Fig. 1. As shown in Fig. 2, the circuit may comprise generally a transistor source of gain 10 having an emitter 12 with input circuit 1, and a collector 13 with an output circuit 2 which may be connected through an output circuit coupling transformer T and an output circuit coupling crystal diode D3 to an output load circuit 3. An external feedback path 4 may connect the output of the diode D3 with the emitter 12 through input circuit 1 of the transistor gain source 10 and may comprise a series resistor R4, a diode clamping voltage circuit D5, and diode logic circuits 5, 6 comprising an Or-circuit 5 (D4, D6, R3) and an And-circuit 6 (R3, D2, R1, R2, D1). A positive pulse input source 7 may be connected through the Or-circuit 5 and the And-circuit 6 with the emitter 12 of input circuit 1 of the transistor gain source 10, and an alternating current sine wave master clock source 8 may be connected through the And-circuit 6 with the emitter 12 of input circuit 1 of the transistor source of gain 10.

As shown in Fig. 2, the transistor source of gain 10 may comprise a point contact type of transistor 10 comprising a germanium or other suitable semiconductor body 15 provided with an emitter input electrode 12, a collector output electrode 13, and a grounded base 14. In accordance with a feature of this invention, the transistor source of gain 10 utilized may comprise a suitable type of transistor 10 which may be overdriven by the associated input circuit 1 and operated over a range which may extend from the region below cutoff thereof to the region of saturation thereof such as near or slight saturation thereof. For this purpose, the transistor source 10 may comprise, for example, a known M–1831 transistor unit or other suitable high speed transistor unit.

As shown in Fig. 2, the collector 13 and output circuit 2 of the transistor source of gain 10 may be connected with an output circuit coupling transformer T which may comprise a primary winding 16 and a secondary winding 17 having a suitable ratio of turns, and connected respectively with the collector electrode 13 of the transistor 10 and the output circuit coupling diode D3. A suitable negative direct current source of supply bias voltage E2 may be connected through the transformer primary winding 16 to the collector electrode 13 of the point contact transistor 10, and a suitable negative direct current source of supply voltage E3 may be connected through the secondary transformer winding 17 to the output circuit diode D3. The transformer T may be provided in the output circuit 2 for obtaining direct current restoration, and for other purposes as for providing a certain amount of impedance matching. The transformer T and the diode D3 may form part of the over-all external feedback path 4 which may be considered as connecting the collector 13 with the emitter 12 of the transistor gain source 10. The grounded base transistor 10 may be operated with the bias voltage E2 applied to the collector 13 through the primary winding 16 of the output circuit transformer T. In this arrangement, with biasing of the collector 13 provided through the transformer winding 16, a more efficient biasing may be obtained with less average power dissipated. The diode D3 may be used as a back bias device to disconnect the load 3 and the feedback path 4 from transformer T during the negative ringing interval.

The clamping voltage circuit comprising the clamping diode D5 connected with a suitable negative direct current source of supply voltage E-clamp may be connected to a suitable connection point in the feedback path 4, as adjacent the Or-circuit diode D4. This connection point may, as shown in Figs. 2 and 3, be at a point 19 located between the diode D4 and the resistor R4; or alternatively this connection point may, as shown in Fig. 4, be located at the junction 20 between the Or-circuit diodes D4 and D6. In accordance with a feature of this invention, the clamping voltage circuit comprising the diode D5 and the supply voltage source E-clamp may be utilized to reduce current and voltage ripple, at the frequency of the clock wave source 8, developed at the input 20 and the output 3 by the negative half-cycles of the clock wave source 8.

As to the diode logic circuits of Fig. 2, the logic Or-circuit 5 thereof may comprise a crystal diode D4 connected in the feedback path 4, a crystal diode D6 connected with the positive pulse wave input source 7, and a resistor R3 which may also be considered as part of the logic circuit. The junction connection 20 between the diodes D4, D6 and the resistor R3 may be connected, through the resistor R3, to a suitable negative direct current source of supply voltage E1. All diodes may be germanium or other suitable crystal rectifier diodes.

The logic And-circuit 6 of Fig. 2 may comprise a crystal diode D2 connected between the junction connection 20 and the emitter input circuit 1, 12 of the transistor 10, resistors R1 and R2, a clipping diode circuit D1, and the resistor R3 which may also be considered as part of the logic And-circuit 6, the resistor R3 being common to both the logic Or and logic And circuits 5 and 6. The resistor R1 of Fig. 2 may be connected to a sine wave clock source 8, the output positive half sine waves of which may be suitably clipped by a clipping voltage applied at the junction connection 21 through the clipping diode D1 connected with a suitable positive direct current source of supply voltage E-clip for thereby supplying a clipped sine wave voltage to the emitter input circuit 1 of the transistor 10.

In Fig. 2, the circuit components disposed between the negative voltage source E1 and the sine wave source 8 and including therein the resistors R1, R2, and R3 and diode D2 may be considered as a voltage divider. In accordance with a feature of this invention, the voltage divider comprising the circuit elements R1 through R3 of Fig. 2 (or R2 through R3 of Fig. 3) and the positive half-cycles of the clock wave source 8 may be utilized to set the bias on the emitter 12 of the transistor 10 just below outoff value thereof during such positive half-cycles.

While in Figs. 2 and 3 a sine wave clock source 8 has been illustrated, it will be understood that a square wave clock source 8 may be utilized as an alternative arrangement and, if so used, the clipping diode D1 and the resistor R1 may be omitted. In some respects, a square wave clock source 8 may be more advantageous from a standpoint of pulse rise times, while the since wave clock source 8 may be more advantageous from the standpoint of ease of generation. The various diode rectifiers D1 to D7 shown in one or more of Figs. 2 to 4 may be any suitable crystal diodes such as germanium diodes, or other suitable asymmetrically conducting devices.

As an illustrated example in a particular case for the pulse-regenerative amplifier circuit of Fig. 2 using a point-contact M–1831 transistor unit operated at a basic frequency of three megacycles per second from a sinusoidal clock voltage 8 and regenerating 0.17 microsecond pulses at a basic repetition rate of three megacycles per second, the components of the circuit of Fig. 2 may have values approximately as follows: R1=510 ohms, R2=1,000 (1K) ohms, R3=1300 (1.3K) ohms, R4=510 ohms, E1=−6 volts, E2=−18 volts, E3=−1 volt, E-clip=+3 volts, E-clamp=−0.5 volt. The sine wave clock source 8 may operate at three megacycles per second with 14 volts peak-to-peak biased to ground. The diodes D1, D2, D3, D4, D5, D6 may be germanium crystal diodes. The pulse source 7 may be of a suitable positive pulse source of about 2 volts. The transistor 10 may be in M–1831 point-contact transistor unit. The transformer T may have a ratio of primary 16 to secondary 17 turns $N/1$ of suitable value to properly drive the load 3. While particular values have been given above in connection with the illustrative present example, it will be understood that other values and components may be utilized to suit the particular requirements.

Fig. 3 is a schematic circuit diagram illustrating a pulse-regenerative transistor amplifier circuit which may be utilized as an alternative arrangement to implement the functional block diagram shown in Fig. 1. The circuit of Fig. 3 is similar to that shown in Fig. 2 except for the use of a different configuration for the And-circuit 6.

As to the diode logic circuits in Fig. 3, the diode logic Or-circuit 5 in Fig. 3 may comprise the crystal diodes D4 and D6 and the resistor R3 as in Fig. 2; and the diode logic And-circuit 6 in Fig. 3 may comprise the crystal diodes D2 and D7, the resistors R2 and R3 and the positive direct current supply source E4, the resistor R3 being common to both the Or and the And diode logic circuits 5 and 6 in Fig. 3 as in Fig. 2. It will be noted that the diode logic And-circuit 6 in Fig. 3 differs from that in Fig. 2.

As illustrated in Fig. 3, a voltage divider comprising circuit components disposed between the source of negative direct current supply voltage E1 and the source of positive direct current supply voltage E4, may comprise series resistors R2 and R3 and diode D2. In Fig. 3, the voltage divider referred to may be utilized with the positive half-cycles of the clock wave source 8 to set the bias on the emitter electrode 12 of the transistor 10 to a value in the region just below cutoff value thereof during said positive half-cycles of the clock wave source 8, for thereby establishing a voltage wave form at the emitter electrode 12 suitable in value for enabling the transistor 10 only during the positive half-cycles of the clock wave source 8. It will be noted that the voltage divider provided in Fig. 2 comprises the circuit components disposed between the clock wave source 8 and the source of direct current supply voltage E1; and in Fig. 3 the circuit components disposed between the source E1 and the source E4.

Fig. 4 is a circuit diagram illustrating a modification in the connection point for the diode clamping circuit D5, which may be utilized as an alternative connection for that shown in the circuits of Figs. 2 and 3. As shown in Fig. 4, the diode clamping circuit D5 may be connected to the junction 20 disposed between the crystal diodes D4, D6, D2 and the resistor R3 instead of being connected to the connection point 19 disposed between the diode D4 and the resistor R4 as shown in Figs. 2 and 3.

As illustrated in Figs. 2, 3 and 4, the clamping diode D5, connected with a suitable source of negative direct current supply voltage E-clamp, may be connected to a suitable connection point located in the feedback path 4 adjacent the diode D4, for reducing current and voltage rippel at the frequency of the clock wave source 8 that may be developed at the amplifier input and output circuits by the negative half-cycles of alternating current waves from the clock wave source 8, thereby to substantially eliminate undesired currents at the frequency of the clock wave source 8 from appearing in the output circuit 3 of the transistor 10.

Among the features of interest provided in accordance with this invention and illustrated in the foregoing Figs. 2 to 4, the following may be noted particularly:

(*a*) The regenerative amplifier may employ an overdriven transistor 10 source of gain operated over a range which may extend from the region below cutoff thereof to the region of at least some saturation thereof.

(*b*) A voltage divider circuit may be provided and operated with the positive half-cycle of the alternating current clock wave source 8 to set the emitter 12 bias just below cutoff value thereof during the positive half-cycle. This arrangement involves the use of the clock path And-circuit 6 in combination with the emitter 12 and may be used to establish a voltage wave form at the emitter 12 suitable for enabling the transistor 10 only during the half-cycle when the clock wave source 8 voltage is positive. The voltage divider referred to may comprise the series-connected resistance and diode components of the And-circuit 6 that may be disposed between the clock wave source 8 of Fig. 2 or the direct current source E4 of Fig. 3 and a suitable source of direct current supply voltage comprising E1 of Figs. 2 and 3.

(*c*) The negative half-cycle of the clock wave source 8 may be utilized to draw the emitter 12 potential substantially or sufficiently below cutoff value of the transistor 10 for such purposes as (1) disabling the amplifier or (2) providing for transistor 10 turn-off, following operation of the amplifier, for those transistors 10 which may have limited values of negative valley voltages at G in Fig. 6. In this arrangement, the negative swing of the emitter 12 potential may provide for the turn-off of the type of transistors 10 referred to, or for disabling the amplifier.

(*d*) The transistor 10 may be overdriven by driving the transistor 10 into slight or partial or near saturation or far enough into saturation thereof to realize greater or maximum transistor efficiency as measured by the ratio of pulse power to direct current power; and also to aid in flattening pulse tops. In this arrangement, the degree of saturation may be limited to values sufficiently below full saturation to avoid any undesired pulse broadening effect that may be caused by the so-called "hole-storage" effect. The transistor 10 may be so driven into saturation by means of a suitable source of positive voltage, E-clip of Fig. 2 or E4 of Fig. 3, connected to the transistor emitter 12 through a suitable resistor R2.

(*e*) A clamping diode circuit D5 may be utilized to substantially eliminate undesired current at the clock wave source 8 frequency in the transistor source output 3. By this arrangement, current and voltage ripple which may be developed at the amplifier input and output by the negative half-cycle of the clock wave source 8, may be substantially reduced. The clamping diode circuit D5 may be connected to the feedback path 4 at a suitable point therein, as at point 19 in Figs. 2 and 3 or at junction 20 in Fig. 4.

(*f*) A clipping diode circuit D1 (Fig. 2) may be provided to permit an associated sine wave clock source 8 to produce a relatively constant emitter bias just below cutoff during the half-cycle when the clock wave source 8 voltage is positive.

(*g*) A transformer T may be provided. In this arrangement, the transformer mutual inductance, shunt capacity and effective resistance and the transistor output resistance and capacity may be utilized to provide for damped ringing of the transformer T. The transformer T may be disposed in the feedback path 4 of the transistor source 10, as shown in Figs. 2 and 3.

(*h*) Resistance means may be provided to limit the current available to the emitter 12 in the event of failure of the clock wave source 8. In this arrangment, the current limiting resistance means may comprise series resistors, R1 and R2 of Fig. 2, connected between the clock wave source 8 and the transistor emitter 12 in Fig. 2; and resistor R2 connected between the source E4 and the transistor emitter 12 in Fig. 3.

(*i*) Sufficiently large values of resistance R2 and of positive diode clipping voltage E-clip in Fig. 2, or of positive direct current supply voltage E4 in Fig. 3, may be utilized to stabilize the amplitude of the emitter 12 current with moderate variations in transistor 10 emitter characteristics that may be found in using different transistors 10 in the circuit.

The operation of a pulse-regenerative amplifier using a point-contact transistor 10 and operated at a basic frequency of 3 megacycles per second will be described. To produce regenerated pulses with waveshapes which are practically independent of the waveshapes of the input pulses received from input source 7, a germanium diode circuit D2, D4, D6, etc., has been used in conjunction with an external feedback path 4. This arrangement also provides for the synchronization of the output pulses with a master clock 8. Transformer coupling T has been incorporated into the circuit to provide D.-C. restoration.

By way of introduction, in synchronous serial computers of even a moderate degree of complexity, regeneration of pulses in amplitude, shape and time must be performed throughout the system. When logical operations are executed in circuits per se containing active elements such as vacuum tubes or transistors, this pulse regeneration need not be separated from these logical operations since both can be performed simultaneously by the same circuit. One the other hand, logical operations can be carried out in circuits containing only elements which are essentially passive, such as crystal diodes, to reduce the number of active elements required. In such instances pulse regeneration can be provided by other circuits containing active elements.

Regenerative circuits of this latter kind, using point-contact transistors 10 as the active elements, as illustrated in Figs. 2 and 3 have been described. In the operation to be described, the transistor 10 operates as an overdriven amplifier with external pulse feedback at 4 used in conjunction with germanium diodes D2, D4, D6 etc., to provide the pulse regeneration. This mode of operation is in contrast to that of known bistable circuits which utilize internal feedback supplied by the base resistance of the transistor. In the operation to be described, the complete unit, to which a sinusoidal clock voltage 8 is supplied, regenerates 0.17 microsecond pulses at a basic repetition rate of 3 megacycles per second. One of the desirable features of its operation at this order of frequency is that its performance is relatively unimpaired by a slow recovery of reverse impedance which is found in many crystal diodes.

A block diagram of one possible logical configuration for the regenerative amplifier is shown in Fig. 1, and implemented in Figs. 2, 3 and 4. These circuits utilize the principle of external feedback. In these circuits, a coincidence between an input signal from the input source 7 and the proper portion of the clock wave from the clock wave source 8 is used to initiate an output pulse. Therefore, if the leading edge of the input signal from the source 7 is arranged to arrive slightly prior to this portion of the clock wave, the clock 8 determines the timing of the start of the output pulse. To assure that the clock 8 also determines the duration of the output pulse, an external feedback path 4 returns the output pulse in such a manner as to make it equivalent in effect to the original input signal. In this fashion, the output pulse can be sustained until terminated by the clock 8, even if the original input signal from the source 7 is removed.

Figs. 2 and 3 are circuit schematics of two slightly different implementations of the block diagram of Fig. 1. The ensuing description is concerned more directly with the circuit of Fig. 2; but since the circuit of Fig. 3 differs only in that a different configuration of the And-circuit 6 is used, it will not be treated separately. To aid the description, the performance with no input signal applied from the source 7 will be considered first, and this will be followed by the modification resulting when an input signal from the pulse source 7 is present.

As a starting point, referring to Fig. 2, consider the applied clock potential of the clock wave source 8 to be at the negative peak of the sine wave. At this time diodes D1 and D2 of the And-circuit 6, and the transistor emitter 12 are all in a reverse impedance state. If these reverse impedances were infinite, the emitter potential at 12 would be equal to the applied clock potential; actually, as a result of finite back impedances the emitter potential at 12 will be somewhat less negative at this time. While diode D2 is essentially nonconducting, the potential V2 at the junction 20 of diodes D2, D4 and D6 and resistor R3, is E-clamp minus the series forward voltage drops across diodes D4 and D5. This is based on the assumption that no current flows through diode D6 or resistor R4 toward this junction 20.

As the applied clock potential from sine wave source 8 becomes less negative, the emitter potential at 12 also rises. Diodes D1 and D2 and the transistor emitter 12 remain nonconducting until the emitter 12 reaches the potential V2 of junction 20, at which time diode D2 changes to the low forward impedance state. From this point, as the clock potential of source 8 becomes still less negative and then positive, current flows through resistors R1 and R2 and diode D2 from the clock source 8 to the diode junction 20 of diodes D2, D4, D6 at which point 20 the potential V2 is measured. This current does not appreciably change the potential V2 at junction 20, but rather replaces a portion of the current which had been flowing through diodes D4 and D5 into resistor R3. Thus the change in potential V2 at junction 20 is only the small change in forward voltage drops across these diodes D4 and D5 resulting from the decrease in current through them.

When the applied clock voltage from sine wave source 8 becomes sufficiently positive to raise the potential V1 at the junction 21 of resistors R1 and R2 and diode D1 to the value E-clip, diode D1 begins to conduct. Through this means the positive clock voltage from source 8 is clipped, the potential V1 at junction 21 remaining at E-clip (plus the small forward voltage drop across diode D1) until the positive peak of the clock voltage sine wave from source 8 has passed and the clock voltage is no longer sufficiently positive to maintain the potential V1 at E-clip. During this clipping interval, both the potential V2 at junction 20 and the emitter potential at 12 are essentially constant and the emitter 12 remains slightly below cutoff. As the potential V1 at junction 21 becomes less positive than E-clip, the diode D1 again becomes non-conducting. The cycle of input circuit operation, with no input signal present from the source 7, is completed as the sine wave clock voltage from source 8 swings toward the negative peak of the sine wave. Diode D2 becomes non-conducting as the emitter potential at 12 drops below the potential V2 at junction 20, which is again clamped by diodes D4 and D5 as at the beginning of the cycle.

Figure 5:
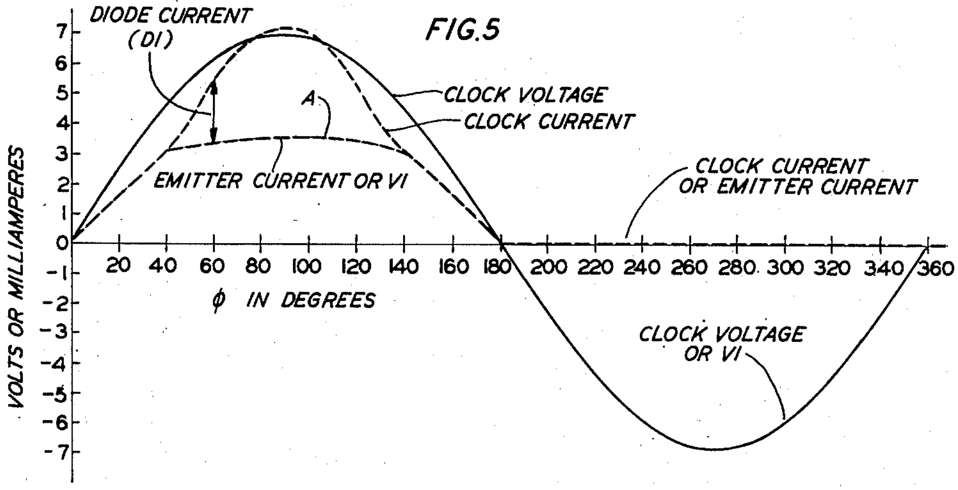
Fig. 5 is a graph illustrating voltage and current waveshapes for the regenerative amplifier shown in Fig. 2.

In Fig. 5, waveshapes of some of the input circuit voltages and currents are plotted. The values of the constants which were used for the calculations are those indicated above in the example given in connection with Fig. 2, with the exception that the emitter 12 is now assumed to run at ground potential while the source 8 clock potential is positive, and at the clock potential when the latter is negative. These assumptions are reasonably valid whether or not an input signal from source 7 is present. When no input signal from source 7 is present, as has been assumed to this point, the curve A in Fig. 5 labeled, "V1 or emitter current," should be interpreted as, "V1 or current through diode D2."

Application of positive pulses from the source 7 to the input 20 modifies the performance of the input circuit during the intervals when the sine wave clock voltage of source 8 is positive. For the desired or proper operation, which implies that the clock 8 completely determines the timing of the output pulses, the input pulse from positive pulse source 7 may be applied prior to the time when the clock voltage from source 8 swings positive through zero. When this is the case, diode D2 does not begin to conduct, as it does when no input pulse from source 7 is present, since potential V2 at junction 20 is now more positive as a result of the presence of the positive input pulse from source 7. The input pulse from source 7 causes diodes D4 and D5 to become nonconducting. For diode D2 to conduct, the emitter potential at 12 would have to be driven as positive as potential V2 at junction 20 by the clock voltage from source 8. Before this occurs, however, the emitter potential at 12 reaches the value, referred to as the "break point" F at which the transistor 10 emerges from the cutoff region thereof.

After this break point F has been reached, the transistor emitter 12 characteristic of transistor 10 is such that for most external collector 13 impedances thereof, a large increase in emitter current can occur with only a slight change in emitter potential at 12. Moreover, this slight change may be either positive or negative, depending on the particular transistor 10. Thus, essentially the current which flows through diode D2 when no input signal from source 7 is present, is diverted into the transistor emitter 12 when such an input signal from source 7 is applied.

Figure 7:
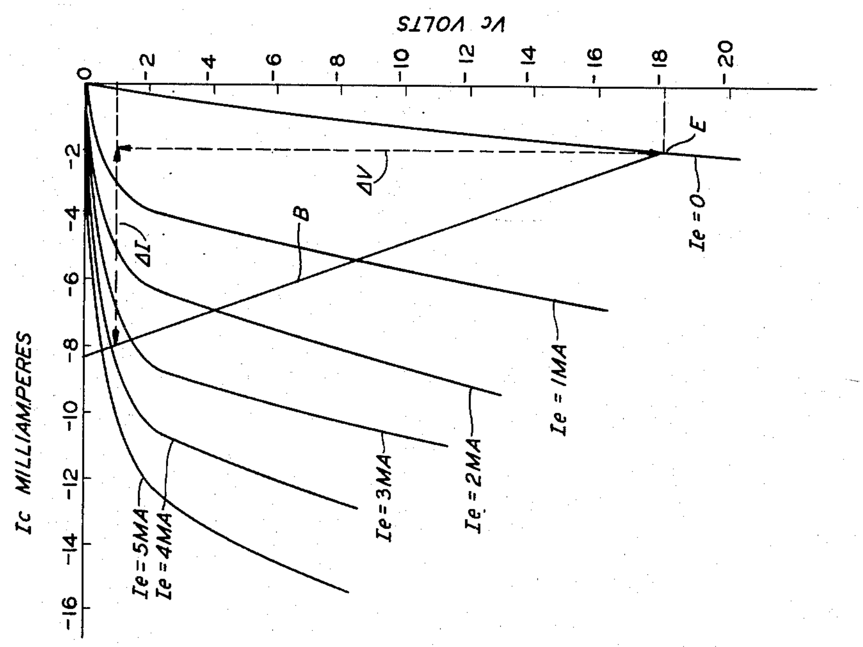
Figs. 6 and 7 are graphs of transistor characteristics to illustrate development of a pulse.
Figure 6:
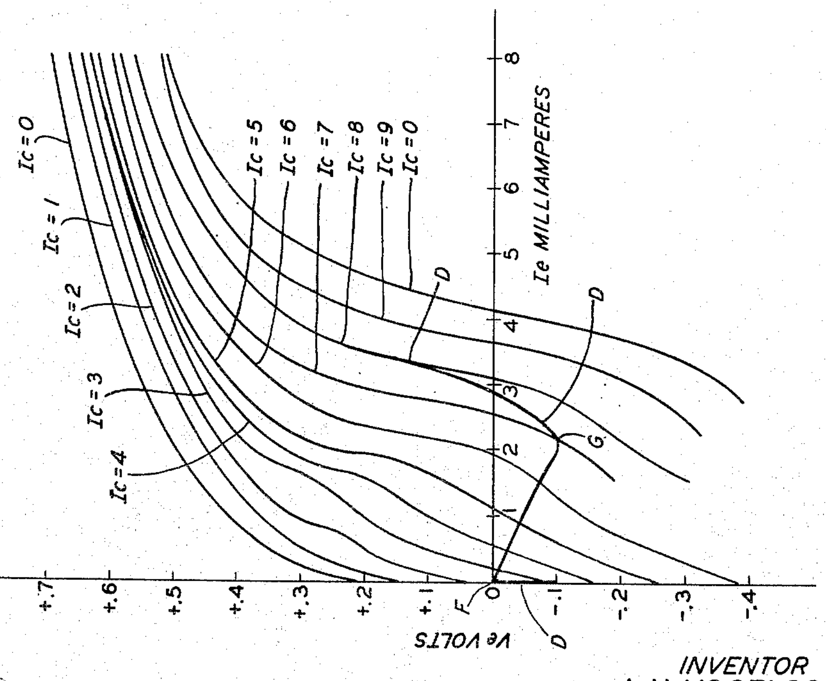

In Figs. 6 and 7, voltage-current characteristics for both emitter ($e$) and collector ($c$) for a typical transistor unit have been included. To illustrate the action of the transistor, a linear load line B has been plotted on the collector characteristic in Fig. 7 and has then been transferred to the emitter characteristic in Fig. 6 where it is no longer linear as shown at D. The line B in Fig. 7 as plotted on the collector characteristic, has a 3000 ohm slope and passes through the point at E where $I_e=O$, $V_c=$about $-18$ volts. With the particular transistor that was used to obtain these characteristics, a slight negative resistance is evident at the emitter in the region to the right of the break point F; but another transistor might have displayed a zero, or even positive, resistance in this region.

If the particular voltages and circuit constants indicated above in connection with the example given for the Fig. 2 circuit are assumed, the presence of an input pulse from the source 7 results in a change in emitter current from a very slightly negative (−) value to a positive (+) value of approximately 3.5 milliamperes. The excursions over the emitter and collector characteristics are indicated by the load lines B and D between these extremities. In Fig. 7, the pulse voltage and current developed at the collector (3) have been indicated as $\Delta V$ and $\Delta I$ respectively. Since the collector 13 is not driven too deeply into saturation, the unpredictable pulse broadening which results from "hole-storage" is avoided.

Figure 8:
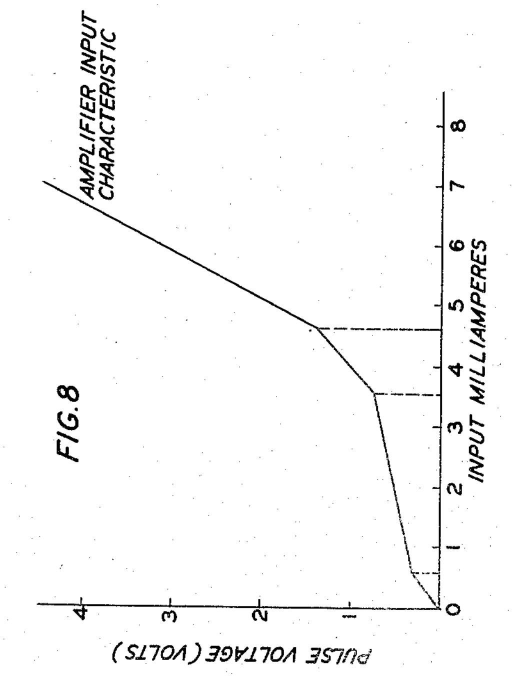
Fig. 8 is a graph illustrating straight line approximations to the regenerative amplifier input resistance characteristic.
Figure 9:
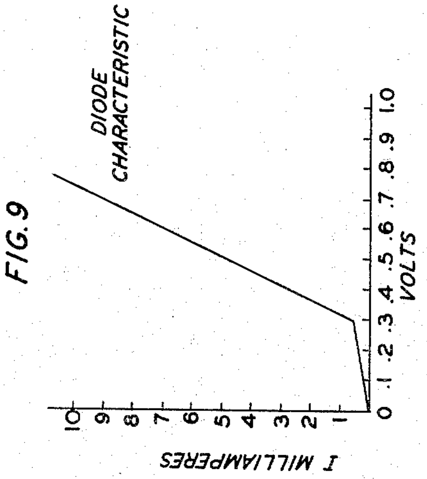
Fig. 9 is a graph illustrating straight line approximations to a diode characteristic.

In general, the load lines corresponding to circuits which the amplifier of Figs. 2 and 3 will be called upon to drive will not be simple straight lines as at B in Fig. 7. In fact, if reactances are neglected, they are apt to be similar to the characteristic plotted in Fig. 8, which is a plot of the input resistance of this amplifier. To facilitate the calculations for this plot in Fig. 8, the 2-straight line approximation to a diode characteristic, shown in Fig. 9 has been assumed for all diodes. The sharp corner in this characteristic in Fig. 9 is responsible for the sharp corners in the input resistance characteristic of Fig. 8.

As shown in Figs. 2 and 3, the transistor collector 13 is coupled to the load 3 through a transformer T and a diode D3. The purpose of the transformer T is twofold. First, it matches impedance to the extent that nonlinear impedances can be matched. Second, it makes possible more satisfactory D.-C. restoration than can be obtained if a condenser is used for coupling. For transistor circuits of this type, capacitive coupling may result in a considerable reduction in useful pulse amplitude for a train of pulses as compared to the amplitude of a single isolated pulse. If a properly designed transformer T is used, however, the useful amplitude of the pulses can be maintained essentially constant regardless of the number of consecutive pulses.

To obtain complete D.-C. restoration, where complete is here used to indicate a maintenance of the overall waveform and not merely amplitude, the total energy stored in the transformer T mutual inductance and in the shunt capacitance of both the transformer T and the transistor 10 output during the pulse, should be completely removed prior to the start of the next pulse interval. This cannot be done, however, so it may be approximated as closely as possible. The optimum condition involves a ringing by the transformer T, following a pulse, at a frequency of slightly less than that of the clock 8 of 3 megacycles per second for the present example, with damping slightly less than critical. To this end, diode D3 may be arranged to effectively disconnect the load 3 and the feedback path 4 from the transformer T as the transformer T polarity reverses at the termination of a pulse. The transformer T ringing frequency and the damping are then determined by the parallel combination of transformer T mutual inductance, shunt capacity and effective shunt resistance, and the transistor 10 output resistance and capacity.

It should be noted that D.-C. restoration is not obtained without cost. The price paid is the energy stored in the reactive elements during the signal pulse which is a greater amount of energy than would have to be stored if no D.-C. restoration were desired.

As indicated previously, an external feedback path 4 is provided for temporary lock-up to assure proper retiming of the pulse. From Fig. 2, it can be seen that diodes D4 and D6 constitute an Or circuit. Therefore, in returning to the input 1 via diode D4 and current limiting resistor R4, the feedback pulse from path 4 becomes equivalent to the input pulse from source 7. Diode D5 is a low impedance source of current for clamping the potential at the junction 20 of diodes D2, D4 and D6 whenever the clock voltage from source 8 swings negative. With this current source from diode D5 available, the current from clock source 8 need not be supplied through the transformer T, and hence a source of 3 megacycle "noise" of the clock frequency at the amplifier output 3 may be thereby avoided.

As illustrated in Fig. 4, the clamping action of diode D5 may be made more effective if its cathode be brought to the junction 20 of diodes D2, D4 and D6. In Figs. 2 and 3, it has been connected as shown, however, to decrease the possibility of its providing a low impedance shunt across resistor R3, as a result of poor diode reverse recovery, when an input pulse from source 7 is present.

Figure 10:
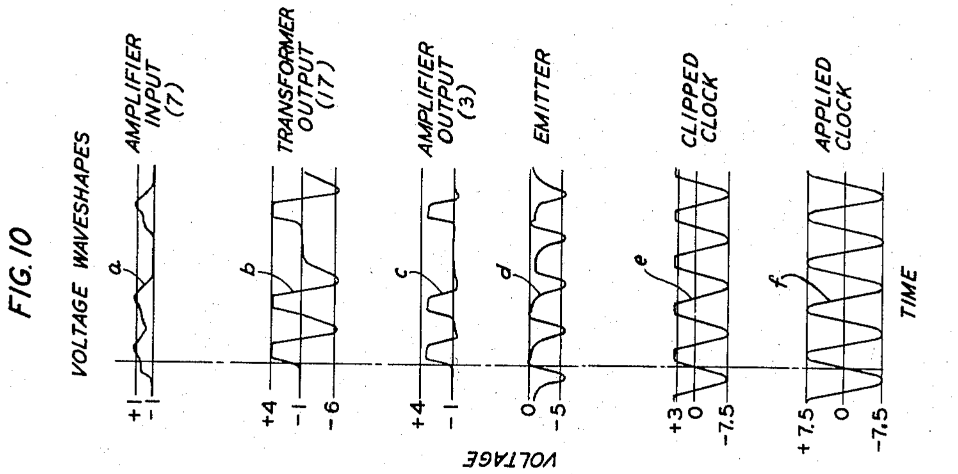
Fig. 10 is a graph illustating reproductions of photographs of actual voltage waveshapes taken at various points in the regenerative amplifier circuit of Fig. 2.

Fig. 10 is a graph illustrating reproductions of photographs of waveshapes at various points in the amplifier of Fig. 2 operating at a basic frequency of 3 megacycles per second. To obtain Fig. 10, a 500 ohm resistive load and a 3:1 transformer T turns ratio for the primary and secondary winding 16 and 17 thereof were employed. As shown and indicated in Fig. 10, the six curves *a* to *f* thereof represent voltage waveshapes at various points of the regenerative amplifier of Fig. 2, namely, curve *a* at the amplifier input 7, curve *b* at the transformer T output, curve *c* at the amplifier output 3, curve *d* at the emitter 12, curve *e* at the clipped clock 21, and curve *f* at the applied clock 8.

For the particular voltages and circuit constants indicated above in connection with the example given for the Fig. 2 circuit, the average 3 megacycle clock 8 power dissipation is approximately 12 milliwatts per amplifier. This figure is substantially the same whether or not the amplifier is being pulsed from source 7. On the other hand, the D.-C. dissipation within the transistor 10 is very nearly equal to the product of $E_2$ and $I_c(O,E_2)$, where $I_c(O,E_2)$ is the collector current corresponding to an emitter current of zero and a collector voltage of $E_2$. The exact value, therefore, is directly dependent upon the particular transistor 10, but is usually less than 50 milliwatts. An additional 25 milliwatts of D.-C. power are dissipated external to the transistor.

As described hereinbefore, two different implementations of the And-circuit 6 in the input 1 of the transistor 10 have been indicated in Figs. 2 and 3, respectively. The arrangement of Fig. 2 may be superior to that of Fig. 3 in respect to time recovery in that a slow recovery of reverse impedance in diode D7 in Fig. 3 may be detrimental to the performance of the Fig. 3 circuit. If the sine wave clock 8 in Fig. 3 were applied directly to this diode D7, the transistor emitter potential at 12 could be carried over the break point by each of the positive voltage swings of the clock 8 regardless of the presence or absence of an input signal from source 7. As shown in Fig. 3, a clipping circuit consisting of resistor R1 and diode D1 may be used to alleviate this condition, however, by clipping the positive peaks of the clock voltage from source 8 at a value slightly more positive than the transistor 10 break point. The normal running potential at the emitter 12 could, of course, be made more negative, but this would necessitate larger input pulses from source 7 to operate the amplifier.

The analytical expressions defining output pulse rise times are different for the two circuit versions of Figs. 2 and 3. Specifically, these differences reflect the fact that, for the circuit of Fig. 2, the emitter current at 12 is supplied from the sinusoidal clock generator 8, whereas, for that of Fig. 3, it is supplied from a positive source of constant potential E4. The equivalent circuit representation assumed for both the Figs. 2 and 3 circuits, neglecting the transformers T, is shown in Fig. 11. To differentiate the cases in Figs. 2 and 3, the applied voltage is assumed to be the product of a sine wave and a step function in one instance, and only a step function in the other. The only frequency-dependent element introduced into the T-equivalent for the transistor 10 is the mutual impedance, $Z_m$, which is postulated to have the form $$\frac{R_m}{1+j\frac{\omega}{\omega_c}}$$

Based on these conditions, the equations for the output voltage response are:

for $E=E_0 \sin \omega_0 t u(t)$:

$$V(t)=\gamma E_0\left[\frac{(\lambda-\beta)\frac{\omega_c}{\omega_0}}{\left(\beta\frac{\omega_c}{\omega_0}\right)^2+1}\epsilon^{-\beta\omega_c t}+\sqrt{\frac{\left(\lambda\frac{\omega_c}{\omega_0}\right)^2+1}{\left(\beta\frac{\omega_c}{\omega_0}\right)^2+1}}\sin(\omega_0 t+\psi)\right] \quad (1)$$

for $E=E_1u(t)$:

$$V(t)=\gamma E_1\left[\frac{\lambda}{\beta}-\left(\frac{\lambda}{\beta}-1\right)\epsilon^{-\beta\omega_c t}\right] \quad (2)$$

where $$\beta=\frac{[(R_1+r_e+r_b)(R_2+r_c+r_b)-r_b(r_b+R_m)]}{(R_1+r_e+r_b)(R_2+r_c+r_b)-r_b^2}$$

$$\gamma=\frac{R_2 r_b}{(R_1+r_e+r_b)(R_2+r_c+r_b)-r_b^2}$$

$$\lambda=1+\frac{R_m}{r_b}$$

$$\psi=\varphi_1-\varphi_2$$

$$\varphi_1=\tan^{-1}\frac{\omega_0}{\lambda\omega_c}$$

$$\varphi_2=\tan^{-1}\frac{\omega_0}{\beta\omega_c}$$

Generally, $\lambda$ is much larger and $\beta$ slightly smaller than unity, so the following simplified expressions are satisfactory.

For $E=E_0 \sin \omega_0 u(t)$:

$$V(t)\approx\gamma\lambda E_0\frac{\omega_c}{\omega_0}\left[\frac{1}{\left(\beta\frac{\omega_c}{\omega_0}\right)^2+1}\epsilon^{-\beta\omega_c t}+\frac{1}{\sqrt{\left(\beta\frac{\omega_c}{\omega_0}\right)^2+1}}\sin(\omega_0 t-\varphi_2)\right] \quad (3)$$

and for $E=E_1u(t)$:

$$V(t)\approx\frac{\gamma\lambda E_1}{\beta}(1-\epsilon^{-\beta\omega_c t}) \quad (4)$$

Equations 1 and 3 are, of course, valid only prior to the time when the clipping of the clock 8 commences.

It is noted that the circuit of Fig. 3 is superior to that of Fig. 2 with regard to rise time. This follows from the fact that the limiting best response obtainable by Equation 3 is sinusoidal, whereas, Equation 4 indicates a limiting best response which is a step function. Use of a square-wave clock 8 with the circuit of Fig. 2 can nullify this difference, however, if a satisfactory clock source 8 of this square-wave type is available. As a substitute, a sinusoidal clock voltage at 8 with excessive amplitude may be used with the clipping level unchanged, but such a course is wasteful of clock power.

Other rise time information is conveyed by the above equations. For instance, increasing the load resistance R12 may shorten rise times if the transistor 10 is driven to saturation. Increasing R12 has the effect of increasing the multiplying factor, $\gamma$, and thereby causes $V(t)$ to rise toward a greater ultimate value. When the transistor collector 13 reaches the saturation region, where further increases in emitter 12 current produce little change in collector 13 current, $V(t)$ is arrested at a maximum value which is less than the ultimate value indicated by the equations. Since either a sinusoidal or an exponential rise is being halted short of a goal, a reduction in rise time is effected.

Also useful for providing shorter output pulse rise times are transistors 10 for which $\lambda$ is large, in that they can more readily be driven to saturation. To a certain extent, $\lambda$ is a measure of transistor 10 gain, and it can be seen that it is a multiplying factor in both response expressions. It should be pointed out again, though, that pulse broadening is apt to result from "hole-storage" if the transistor unit 10 is driven too deeply into saturation.

Figs. 12 and 13 are included to indicate the extent to which transistor 10 cutoff frequency influences rise time in the circuits of Figs. 2 and 3 respectively. They have been plotted from Equations 3 and 4, respectively, for the single case of an assumed $\beta$ of 0.9. In either figure, Fig. 12 or 13, the higher cutoff frequencies produce the shorter rise times, but a point of diminishing returns is reached. It is interesting to note that when transistors 10 are driven into the saturation region, gain may be traded for cutoff frequency and vice versa. Best over-all performance may nevertheless be obtained with transistors 10 having both a high cutoff frequency and large current gain.

Although this invention has been described and illustrated in relation to specific arrangements, it is to be understood that it is capable of application in other organizations and is therefore not to be limited to the particular embodiments disclosed.

What is claimed is:

1. Amplifier apparatus for producing regenerated output pulses comprising a transistor source of gain having emitter input and collector output circuits, an external feedback path connecting said collector output circuit with said emitter input circuit, a diode circuit comprising a plurality of crystal diodes connected with said feedback path leading to said emitter input circuit, means including a source of input pulses connected to said emitter input circuit through said diode circuit, and circuit means connected to a point in said feedback path leading to said emitter input circuit and comprising means including an alternating current wave source for timing said regenerated output pulses synchronously in accordance with the frequency of said wave source and means adapted to supply sufficient current to said emitter input circuit for operatively overdriving said transistor source beyond the linear range thereof.

2. Amplifier apparatus for producing regenerated output pulses comprising a transistor source of gain having emitter input and collector output circuits, an external feedback path connecting said collector output circuit with said emitter input circuit, a diode circuit comprising a plurality of crystal diodes connected with said feedback path leading to said emitter input circuit, means including a source of input pulses connected to said emitter input circuit through said diode circuit, and circuit means connected to a point in said feedback path leading to said emitter input circuit and comprising means including an alternating current wave source for timing said regenerated output pulses synchronously in accordance with the frequency of said wave source and means adapted to supply sufficient current to said emitter input circuit for operatively overdriving said transistor source beyond the linear range thereof, said alternating current wave source comprising a sine wave source, and said circuit means disposed between said sine wave source and said point in said path leading to said emitter input circuit comprising series resistance means and a crystal diode clipping circuit connected to said resistance means.

3. Amplifier apparatus for producing regenerated output pulses comprising a transistor source of gain having emitter input and collector output circuits, an external feedback path connecting said collector output circuit with said emitter input circuit, a diode circuit comprising a plurality of crystal diodes connected with said feedback path leading to said emitter input circuit, means including a source of input pulses connected to said emitter input circuit through said diode circuit, and circuit means connected to a point in said feedback path leading to said emitter input circuit and comprising means including an alternating current wave source for timing said regenerated output pulses synchronously in accordance with the frequency of said wave source and means adapted to supply sufficient current to said emitter input circuit for operatively overdriving said transistor source beyond the linear range thereof, said last-mentioned means comprising a source of positive voltage and a resistor disposed between said last-mentioned source and said point in said path leading to said emitter input circuit for driving said transistor source into saturation value thereof beyond said linear range sufficiently to obtain reasonably flat-topped form for said output pulses and greater transistor source pulse power efficiency while simultaneously limiting said saturation value sufficiently to avoid an undesired pulse broadening effect in said output pulses.

4. Amplifier apparatus for producing regenerated output pulses comprising a transistor source of gain having emitter input and collector output circuits, an external feedback path connecting said collector output circuit with said emitter input circuit, a diode circuit comprising a plurality of crystal diodes connected with said feedback path leading to said emitter input circuit, means including a source of input pulses connected to said emitter input circuit through said diode circuit, and circuit means connected to a point in said feedback path leading to said emitter input circuit and comprising means including an alternating current wave source for timing said regenerated output pulses synchronously in accordance with the frequency of said wave source and means adapted to supply sufficient current to said emitter input circuit for operatively overdriving said transistor source beyond the linear range thereof, and a voltage divider circuit passing through said point in said path leading to said emitter input circuit comprising circuit elements disposed between said wave source and a source of negative direct current supply voltage, said voltage divider circuit constituting means responsive to the positive half-cycles of said wave source for setting the bias potential on said emitter of said transistor source just below the cut-off value thereof during said positive half-cycles for thereby establishing a voltage wave form at said emitter sufficient in value to enable said transistor source only during said positive half-cycles of said wave source when said wave source voltage is positive.

5. Amplifier apparatus for producing regenerated output pulses comprising a transistor source of gain having emitter input and collector output circuits, an external feedback path connecting said collector output circuit with said emitter input circuit, a diode circuit comprising a plurality of crystal diodes connected with said feedback path leading to said emitter input circuit, means including a source of input pulses connected to said emitter input circuit through said diode circuit, and circuit means connected to a point in said feedback path leading to said emitter input circuit and comprising means including an alternating current wave source for timing said regenerated output pulses synchronously in accordance with the frequency of said wave source and means adapted to supply sufficient current to said emitter input circuit for operatively overdriving said transistor source beyond the linear range thereof, and a voltage divider circuit passing through said point in said path leading to said emitter input circuit comprising circuit elements disposed between a source of positive direct current supply voltage and a source of negative direct current supply voltage, said voltage divider circuit constituting means responsive to the positive half-cycles of said wave source for setting the bias potential on said emitter of said transistor source just below the cut-off value thereof during said positive half-cycles for thereby establishing a voltage wave form at said emitter sufficient in value to enable said transistor source only during said positive half-cycles of said wave source when said wave source voltage is positive.

6. An amplifier circuit comprising a transistor having a base electrode, collector electrode, and emitter electrode, a source of input pulses, an alternate current timing source, a feedback path connecting said collector electrode to said emitter electrode, a first diode logic circuit, said feedback path and said source of input pulses being connected to said first diode logic circuit, a second diode logic circuit, said feedback path and said timing source being connected to said second diode logic circuit, a first resistance connected between said timing source and said emitter electrode, a first diode, a first source of direct current potential, said first diode and first source of direct current potential being connected to said first resistance to limit the current applied from said timing source to said emitter electrode, a second resistance, and a second source of direct current potential connected to said second resistance, said second resistance being connected to said emitter electrode through a diode of said second diode logic circuit, whereby said first and second resistances comprise a voltage divider, the voltage applied to said emitter during first alternate cycles of said timing source being essentially the voltage of said timing source and the voltage applied to said emitter during the other alternate cycles of said timing source being dependent on the relative values of said first and second resistances and being such as to bias said emitter electrode just below cut-off.

7. An amplifier circuit comprising a transistor having a base electrode, a collector electrode, and an emitter electrode, a source of input pulses, a feedback path connecting said collector electrode to said emitter electrode, a diode logic circuit, said feedback path and said source of input pulses being connected to said diode logic circuit, and voltage divider means connected to said emitter for applying sufficient current to said emitter when an output is present at said diode logic circuit for operatively overdriving said transistor beyond the linear range thereof.

8. An amplifier circuit in accordance with claim 7 further comprising a source of alternating current timing waves, another diode logic circuit, said feedback path and said timing source being connected to said another diode logic circuit, whereby said current is applied to said emitter by said voltage divider means only during those alternate cycles of said timing source when an output is present at said first mentioned diode logic circuit.

9. An amplifier circuit comprising a transistor having a base electrode, collector electrode and emitter electrode, a source of input pulses, an alternating current timing source, an external feedback path connecting said collector electrode to said emitter electrode, a first diode logic circuit, said feedback path and said source of input pulses being connected to said first diode logic circuit, a second diode logic circuit, said feedback path and said timing source being connected to said second diode logic circuit, voltage divider means connected to said emitter for applying current thereto only during those alternating cycles of said timing source when an output is present at said first diode logic circuit, and means connected to said feedback path intermediate said collector electrode and said first diode logic circuit for eliminating current and voltage ripple in the output of said collector due to said timing source, said last-mentioned means comprising a diode and a source of clamping voltage connected to said diode.

10. An amplifier circuit comprising a transistor having a base electrode, collector electrode, and emitter electrode, a source of input pulses, an alternating current timing source, an external feedback path connecting said collector electrode to said emitter electrode, a first diode logic circuit, said feedback path and said source of input pulses being connected to said first diode logic circuit, a second diode logic circuit, said feedback path and said timing source being connected to said second diode logic circuit, and voltage divider means connected to said emitter for applying current thereto only during those alternate cycles of said timing source when an output is present at said first diode logic circuit, said voltage divider means including means applying a bias to said emitter just below cut-off during said alternate cycles of said timing source in the absence of an output from said first diode logic circuit and means including said timing source for applying a bias to said emitter well below cut-off during the other alternate cycles of said timing source.

References Cited in the file of this patent

UNITED STATES PATENTS

| | | |
|---|---|---|
| 2,556,286 | Meacham | June 12, 1951 |
| 2,620,448 | Wallace | Dec. 2, 1952 |
| 2,643,820 | Williams et al. | June 30, 1953 |
| 2,644,893 | Gehman | July 7, 1953 |
| 2,660,618 | Aigrain | Nov. 24, 1953 |
| 2,712,065 | Elbourn et al. | June 28, 1955 |
| 2,724,780 | Harris | Nov. 22, 1955 |
| 2,748,269 | Slutz | May 29, 1956 |